United States Patent
Buzzi et al.

(10) Patent No.: US 12,376,202 B2
(45) Date of Patent: Jul. 29, 2025

(54) NANO-COOLING IN SOLID-STATE COOKING MICROWAVE OVENS

(71) Applicant: WHIRLPOOL CORPORATION, Benton Harbor, MI (US)

(72) Inventors: Ermanno Buzzi, Varese (IT); Muhammad Khizar, St. Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 1765 days.

(21) Appl. No.: 16/307,187

(22) PCT Filed: Dec. 27, 2016

(86) PCT No.: PCT/US2016/068723
§ 371 (c)(1),
(2) Date: Dec. 5, 2018

(87) PCT Pub. No.: WO2018/125051
PCT Pub. Date: Jul. 5, 2018

(65) Prior Publication Data
US 2019/0387586 A1    Dec. 19, 2019

(51) Int. Cl.
*H05B 6/64*    (2006.01)
*H05B 6/68*    (2006.01)
(Continued)

(52) U.S. Cl.
CPC ............ *H05B 6/642* (2013.01); *H05B 6/686* (2013.01); *H05K 1/18* (2013.01); *H05K 7/20454* (2013.01);
(Continued)

(58) Field of Classification Search
CPC .... H05B 6/686; H05B 6/642; H05K 7/20409; H05K 7/2039; H05K 7/20463;
(Continued)

(56) References Cited

U.S. PATENT DOCUMENTS 3,835,921 A    9/1974   Faris et al.
4,504,718 A *  3/1985   Okatsuka ............... H05B 6/642
                                                    330/297
(Continued)

FOREIGN PATENT DOCUMENTS

CN        1734751 A      2/2006
CN        200953344      9/2007
(Continued)

*Primary Examiner* — Sang Y Paik
*Assistant Examiner* — Bonita Khlok
(74) *Attorney, Agent, or Firm* — Price Heneveld LLP

(57) ABSTRACT

An electromagnetic cooking device includes a cavity in which a foodstuff is placed. A plurality of radio frequency feeds are configured to introduce electromagnetic radiation into the cavity for heating the foodstuff. A radio frequency signal generator is configured to generate a low power radio frequency signal where a high power amplifier is coupled to the radio frequency signal generator where the high power amplifier is configured to amplify the low power radio frequency signal to a high power radio frequency signal. A heat sink is coupled to the high power amplifier where the heat sink includes a flat base coupled to a plurality of fins which extend perpendicularly from a first side of the flat base. A thin metal plate includes a plurality of perforations where the perforations are filled with an epoxy resin having a carbon nanotube loading.

20 Claims, 9 Drawing Sheets

(51) Int. Cl.
  *H05K 1/18* (2006.01)
  *H05K 7/20* (2006.01)
  *B82Y 30/00* (2011.01)
(52) U.S. Cl.
  CPC .... *B82Y 30/00* (2013.01); *H05K 2201/10166* (2013.01)
(58) Field of Classification Search
  CPC .......................... H05K 7/20454; Y02B 40/00; H01L 23/3672; H01L 23/367; H01L 23/3677; H01L 23/3675; H01L 23/373; H01L 23/3737; H01L 23/42; H01L 23/36–3733; H01L 23/3736; B82Y 30/00; F28D 9/0087
  USPC ........................................................ 219/757
  See application file for complete search history.

(56) References Cited

U.S. PATENT DOCUMENTS

| | | | |
|---|---|---|---|
| 7,168,484 B2 | 1/2007 | Zhang et al. | |
| 7,481,263 B2 | 1/2009 | Breier et al. | |
| 7,682,654 B2 | 3/2010 | Cooper et al. | |
| 7,896,611 B2 | 3/2011 | Khanna et al. | |
| 8,080,871 B2 | 12/2011 | Dangelo et al. | |
| 8,322,980 B2 | 12/2012 | Khanna et al. | |
| 8,702,897 B2 | 4/2014 | Lin et al. | |
| 8,796,843 B1 * | 8/2014 | Babic | H01L 23/544 |
| | | | 257/718 |
| 8,988,881 B2 | 3/2015 | Koplow | |
| 2003/0030980 A1 | 2/2003 | Bird et al. | |
| 2004/0265489 A1 | 12/2004 | Dubin | |
| 2005/0161210 A1 * | 7/2005 | Zhong | C09K 5/14 |
| | | | 165/185 |
| 2006/0032622 A1 | 2/2006 | Yen et al. | |
| 2008/0001284 A1 * | 1/2008 | Yuen | H01L 23/373 |
| | | | 423/445 B |
| 2008/0003801 A1 * | 1/2008 | Dubin | B82Y 10/00 |
| | | | 438/599 |
| 2010/0002742 A1 | 1/2010 | Basu | |
| 2011/0032678 A1 | 2/2011 | Altman et al. | |
| 2013/0327505 A1 | 12/2013 | Gonzalez et al. | |
| 2014/0224466 A1 * | 8/2014 | Lin | H01L 23/3737 |
| | | | 165/185 |
| 2014/0345843 A1 * | 11/2014 | Kirkor | H05K 7/2039 |
| | | | 165/185 |
| 2015/0054020 A1 | 2/2015 | Paolella et al. | |
| 2015/0136360 A1 | 5/2015 | Xu et al. | |
| 2018/0310369 A1 * | 10/2018 | Rogers | H05B 6/687 |

FOREIGN PATENT DOCUMENTS

| | | |
|---|---|---|
| CN | 101959788 A | 1/2011 |
| CN | 202084504 U | 12/2011 |
| CN | 103144310 A | 6/2013 |
| CN | 105423363 | 3/2016 |
| CN | 205408372 | 7/2016 |
| EP | 3035773 A1 | 6/2016 |
| JP | S61259096 A | 11/1986 |
| RU | 2336669 C1 | 10/2008 |
| RU | 2616737 C1 | 4/2017 |
| WO | 2005006403 A2 | 1/2005 |
| WO | 2012007722 A2 | 1/2012 |
| WO | 2014131460 A1 | 9/2014 |
| WO | 20150069184 A1 | 5/2015 |

* cited by examiner

NANO-COOLING IN SOLID-STATE COOKING MICROWAVE OVENS

FIELD OF DISCLOSURE

The present disclosure generally relates to a method and device for electromagnetic cooking, and more specifically, to a method and device for thermally regulating the components within a microwave oven.

BACKGROUND

A conventional microwave oven cooks food by a process of dielectric heating in which a high-frequency alternating electromagnetic field is distributed throughout an enclosed cavity. A sub-band of the radio frequency spectrum, microwave frequencies at or around 2.45 GHz cause dielectric heating primarily by absorption of energy in water.

To generate microwave frequency radiation in a conventional microwave, a voltage applied to a high-voltage transformer results in a high-voltage power that is applied to a magnetron that generates microwave frequency radiation. The microwaves are then transmitted to an enclosed cavity containing the food through a waveguide. Cooking food in an enclosed cavity with a single, non-coherent source like a magnetron can result in non-uniform heating of the food. To more evenly heat food, microwave ovens include, among other things, mechanical solutions such as a microwave stirrer and a turntable for rotating the food. A common magnetron-based microwave source is not narrowband and not tunable (i.e. emits microwaves at a frequency that is changing over time and not selectable). As an alternative to such a common magnetron-based microwave source, solid-state sources can be included in microwave ovens which are tunable and coherent.

SUMMARY

In at least one aspect, an electromagnetic cooking device is provided. The electromagnetic cooking device includes a cavity in which a foodstuff is placed, a plurality of radio frequency feeds configured to introduce electromagnetic radiation into the cavity for heating the foodstuff, a radio frequency signal generator configured to generate a low power radio frequency signal, a high power amplifier coupled to the radio frequency signal generator wherein the high power amplifier is configured to amplify the low power radio frequency signal to a high power radio frequency signal, a heat sink coupled to the high power amplifier wherein the heat sink includes a flat base coupled to a plurality of fins extending perpendicularly from a first side of the flat base, and a thin metal plate having a plurality of perforations wherein the perforations are filled with an epoxy resin having a carbon nanotube loading wherein the thin metal plate is positioned between the heat sink and high power amplifier.

In at least another aspect, a method for thermally managing a high power amplifier in an electromagnetic cooking device is provided. The method includes forming a thin metal plate having a plurality of perforations, filling the perforations with an epoxy resin including carbon nanotubes to form a carbon nanotube infused base plate, coupling the carbon nanotube infused base plate to a second side of a heat sink wherein the heat sink includes a flat base coupled to a plurality of fins extending perpendicularly from a first side of the flat base, coupling the second side of the heat sink and the carbon nanotube infused base plate to the high power amplifier, generating a radio frequency with a radio frequency signal generator configured to generate a low power radio frequency signal, amplifying the low power radio frequency signal to a high power radio frequency signal with the high power amplifier coupled to the radio frequency signal generator, and introducing the high power radio frequency (electromagnetic radiation) into a cavity for heating the foodstuff with a plurality of RF feeds.

In at least another aspect, a temperature regulated high power amplifier is provided. The temperature regulated high power amplifier includes a radio frequency signal generator configured to generate a low power radio frequency signal, a high power amplifier coupled to the radio frequency signal generator wherein the high power amplifier is configured to amplify the low power radio frequency signal to a high power radio frequency signal, a heat sink coupled to the high power amplifier wherein the heat sink includes a flat base coupled to a plurality of fins extending perpendicularly from a first side of the flat base, and a thin metal plate having a plurality of perforations wherein the perforations are filled with an epoxy resin having a carbon nanotube loading.

These and other features, advantages, and objects of the present device will be further understood and appreciated by those skilled in the art upon studying the following specification, claims, and appended drawings.

DETAILED DESCRIPTION OF EMBODIMENTS

Figure 1:
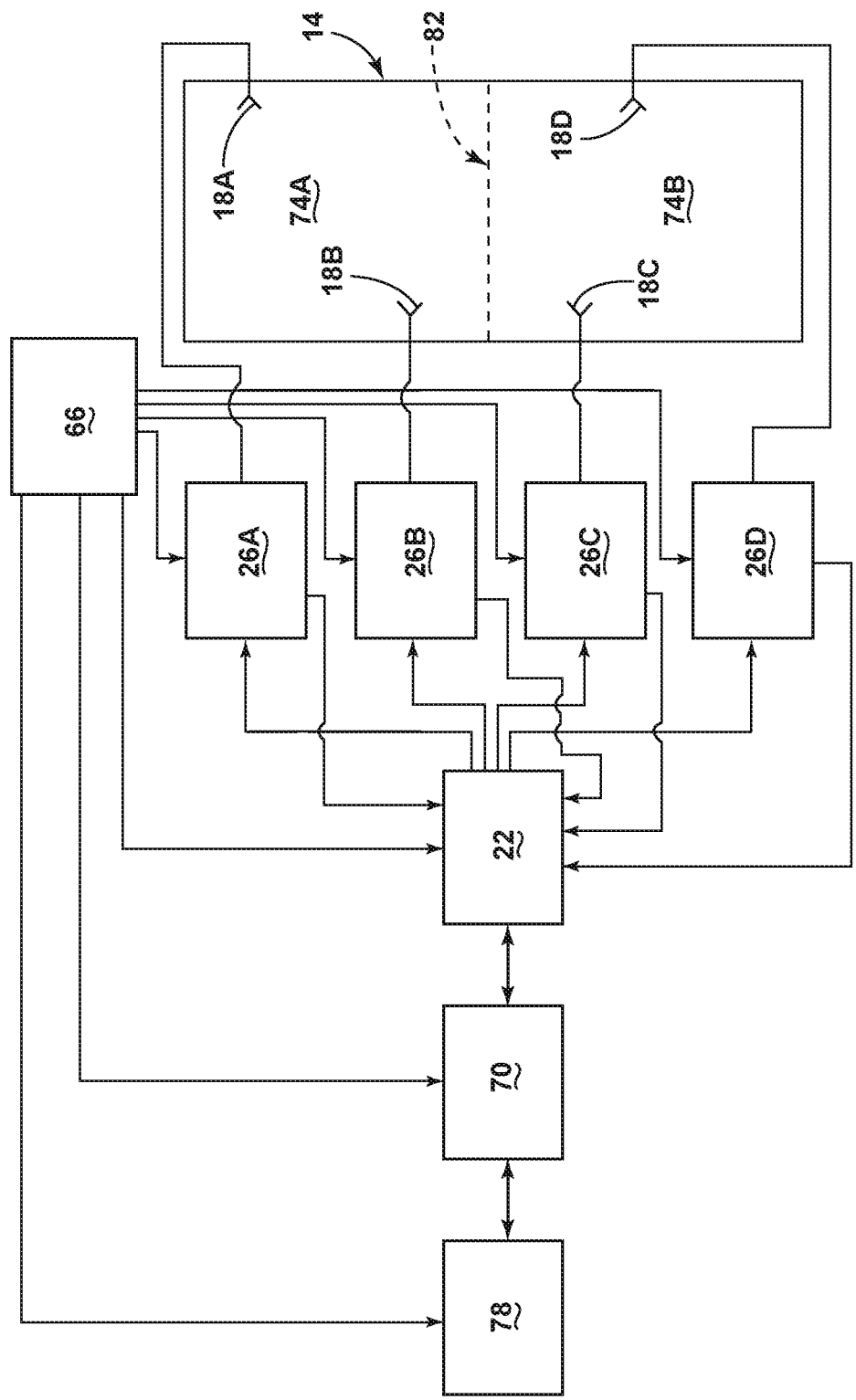
FIG. 1 is a block diagram of an electromagnetic cooking device with multiple coherent radio frequency feeds in accordance with various aspects described herein.

For purposes of description herein the terms "upper," "lower," "right," "left," "rear," "front," "vertical," "horizontal," and derivatives thereof shall relate to the device as oriented in FIG. 1. However, it is to be understood that the device may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

A solid-state radio frequency (RF) cooking appliance heats up and prepares food by introducing electromagnetic radiation into an enclosed cavity. Multiple RF feeds at different locations in the enclosed cavity produce dynamic electromagnetic wave patterns as they radiate. To control and shape of the wave patterns in the enclosed cavity, the multiple RF feeds can radiate waves with separately controlled electromagnetic characteristics to maintain coherence (that is, a stationary interference pattern) within the enclosed cavity. For example, each RF feed can transmit a different frequency, phase and/or amplitude with respect to the other feeds. Other electromagnetic characteristics can be common among the RF feeds. For example, each RF feed can transmit at a common but variable frequency. Although the following embodiments are directed to a cooking appliance where RF feeds direct electromagnetic radiation to heat an object in an enclosed cavity, it will be understood that the methods described herein and the inventive concepts derived therefrom are not so limited. The covered concepts and methods are applicable to any RF device where electromagnetic radiation is directed to an enclosed cavity to act on an object inside the cavity. Exemplary devices include ovens, dryers, steamers, and the like.

Referring to FIGS. 1-12, an electromagnetic cooking device 10 includes a cavity 14 in which a foodstuff is placed. A plurality of RF feeds 18 are configured to introduce electromagnetic radiation into the cavity 14 for heating the foodstuff. A radio frequency signal generator 22 is configured to generate a low power radio frequency signal where a high power amplifier 26 is coupled to the radio frequency signal generator 22 where the high power amplifier 26 is configured to amplify the low power radio frequency signal to a high power radio frequency signal. A heat sink 30 is coupled to the high power amplifier 26 where the heat sink 30 includes a flat base 34 coupled to a plurality of fins 38 which extend perpendicularly from a first side 42 of the flat base 34. A thin metal plate 46 includes a plurality of perforations 50 where the perforations 50 are filled with an epoxy resin 54 having a carbon nanotube loading 58.

FIG. 1 shows a block diagram of an electromagnetic cooking device 10 with multiple coherent RF feeds 18A-D according to one embodiment. As shown in FIG. 1, the electromagnetic cooking device 10 includes a power supply 66, a controller 70, an RF signal generator 22, a human-machine interface 78 and multiple high-power RF amplifiers (or high power amplifiers) 26A-D coupled to the multiple RF feeds 18A-D. The multiple RF feeds 18A-D each transfer RF power from one of the multiple high-power RF amplifiers 26A-D into an enclosed cavity 14.

The power supply 66 provides electrical power derived from mains electricity to the controller 70, the RF signal generator 22, the human-machine interface 78, and the multiple high-power RF amplifiers 26A-D. The power supply 66 converts the mains electricity to the required power level of each of the devices it powers. The power supply 66 can deliver a variable output voltage level. For example, the power supply 66 can output a voltage level selectively controlled in 0.5-Volt steps. In this way, the power supply 66 can be configured to typically supply 28 Volts direct current to each of the high-power RF amplifiers 26A-D, but can supply a lower voltage, such as 15 Volts direct current, to decrease an RF output power level by a desired level.

A controller 70 can be included in the electromagnetic cooking device 10, which can be operably coupled with various components of the electromagnetic cooking device 10 to implement a cooking cycle. The controller 70 can also be operably coupled with a control panel or human-machine interface 78 for receiving user-selected inputs and communicating information to a user. The human-machine interface 78 can include operational controls such as dials, lights, switches, touch screen elements, and displays enabling a user to input commands, such as a cooking cycle, to the controller 70 and receive information. The user interface 78 can include one or more elements, which can be centralized or dispersed relative to each other. The controller 70 may also select the voltage level supplied by power supply 66.

The controller 70 can be provided with a memory and a central processing unit (CPU), and can be preferably embodied in a microcontroller. The memory can be used for storing control software that can be executed by the CPU in completing a cooking cycle. For example, the memory can store one or more pre-programmed cooking cycles that can be selected by a user and completed by the electromagnetic cooking device 10. The controller 70 can also receive input from one or more sensors. Non-limiting examples of sensors that can be communicably coupled with the controller 70 include peak level detectors known in the art of RF engineering for measuring RF power levels and temperature sensors for measuring the temperature of the enclosed cavity or one or more of the high power amplifiers 26A-D.

Based on the user input provided by the human-machine interface 78 and data including the forward and backward (or reflected) power magnitudes coming from the multiple high power amplifiers 26A-D (represented in FIG. 1 by the path from each of the high power amplifiers 26A-D through the RF signal generator 22 to the controller 70), the controller 70 can determine the cooking strategy and calculate the settings for the RF signal generator 22. In this way, one of the main functions of the controller 70 is to actuate the electromagnetic cooking device 10 to instantiate the cooking cycle as initiated by the user. The RF signal generator 22 as described below then can generate multiple RF waveforms, that is, one for each high power amplifier 26A-D based on the settings indicated by the controller 70.

The high power amplifiers 26A-D, each coupled to one of the RF feeds 18A-D, each output a high power RF signal based on a low power RF signal provided by the RF signal generator 22. The low power RF signal input to each of the high power amplifiers 26A-D can be amplified by transforming the direct current electrical power provided by the power supply 66 into a high power radio frequency signal. In one non-limiting example, each high power amplifier 26A-D can be configured to output an RF signal ranging from 50 to 250 Watts. The maximum output wattage for each high power amplifier can be more or less than 250 Watts depending upon the implementation. Each high power amplifier 26A-D can include a dummy load to absorb excessive RF reflections. The multiple RF feeds 18A-D transfer power from the multiple high-power RF amplifiers 26A-D to the enclosed cavity 14. The multiple RF feeds 18A-D can be coupled to the enclosed cavity 14 in spatially separated but fixed physical locations. The multiple RF feeds 18A-D can be implemented via waveguide structures designed for low power loss propagation of RF signals. In one non-limiting example, metallic, rectangular waveguides known in microwave engineering are capable of guiding RF power from a high power amplifier 26A-D to the enclosed cavity 14 with a power attenuation of approximately 0.03 decibels per meter.

Additionally, each of the RF feeds 18A-D can include a sensing capability to measure the magnitude of the forward and the backward power levels or phase at the amplifier output. The measured backward power indicates a power level returned to the high power amplifier 26A-D as a result of an impedance mismatch between the high power amplifier 26A-D and the enclosed cavity 14. Besides providing feedback to the controller 70 and the RF signal generator 22 to implement, in part, a cooking strategy, the backward power level can indicate excess reflected power that can damage the high power amplifier 26A-D.

Along with the determination of the backward power level at each of the high power amplifiers 26A-D, temperature sensing at the high power amplifier 26A-D, including at the dummy load, can provide the data necessary to determine if the backward power level has exceeded a predetermined threshold. If the threshold is exceeded, any of the controlling elements in the RF transmission chain including the power supply 66, controller 70, the RF signal generator 22, or the high power amplifier 26A-D can determine that the high power amplifier 26A-D can be switched to a lower power level or completely turned off. For example, each high power amplifier 26A-D can switch itself off automatically if the backward power level or sensed temperature is too high for several milliseconds. Alternatively, the power supply 66 can cut the direct current power supplied to the high power amplifier 26A-D.

The enclosed cavity 14 can selectively include subcavities 74A-B by insertion of an optional divider 82 therein. The enclosed cavity 14 can include, on at least one side, a shielded door to allow user access to the interior of the enclosed cavity 14 for placement and retrieval of food or the optional divider 82.

The transmitted bandwidth of each of the RF feeds 18A-D can include frequencies ranging from 2.4 GHz to 2.5 GHz. The RF feeds 18A-D can be configured to transmit other RF bands. For example, the bandwidth of frequencies between 2.4 GHz and 2.5 GHz is one of several bands that make up the industrial, scientific and medical (ISM) radio bands. The transmission of other RF bands is contemplated and can include non-limiting examples contained in the ISM bands defined by the frequencies: 13.553 MHz to 13.567 MHz, 26.957 MHz to 27.283 MHz, 902 MHz to 928 MHz, 5.725 GHz to 5.875 GHz and 24 GHz to 24.250 GHz.

Figure 2:
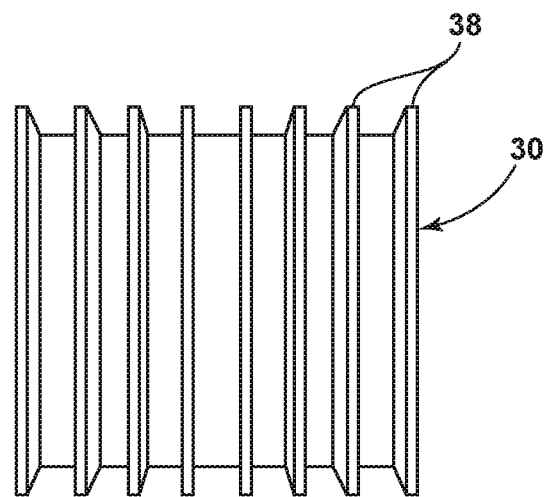
FIG. 2 is a top view of a heat sink.
Figure 3:
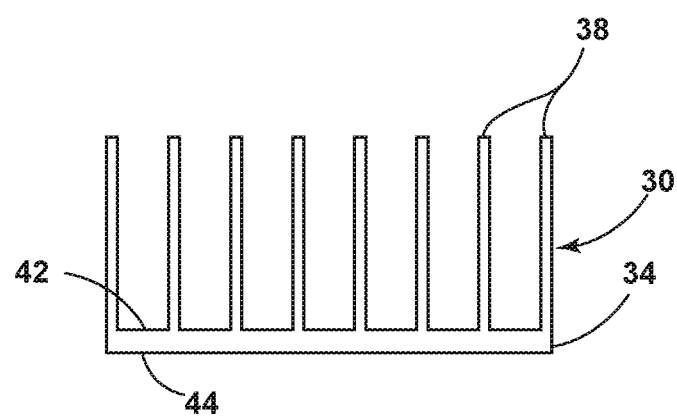
FIG. 3 is a side view of the heat sink shown in FIG. 2.
Figure 4:
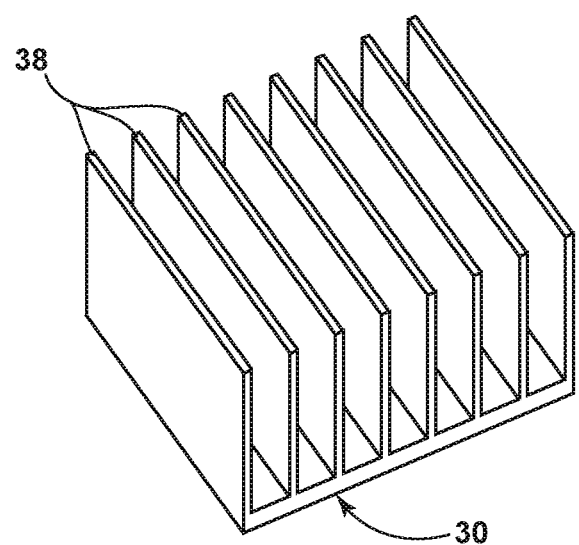
FIG. 4 is a perspective view of the heat sink shown in FIGS. 2-3.

Referring now to FIGS. 2-4, different perspectives of the heat sink 30 are shown. The heat sink 30 includes the flat base 34 coupled to the plurality of fins 38 extending perpendicularly from the first side 42 of the flat base 34. The flat base 34 additionally includes a second side 44 used to couple the heat sink 30 to another surface such as the thin metal plate 46 (FIG. 5) or the high power amplifier 26 (FIG. 1). The heat sink 30 may be fabricated from highly thermally conductive materials such as metals, ceramics, or composites. In some embodiments, the heat sink 30 may be made or constructed from a metal including copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof. In some embodiments, the heat sink 30 may be made or constructed from copper and in other embodiments the heat sink 30 may be made or constructed from aluminum.

The heat sink 30 may be designed to optimize heat loss depending on the desired application. For example, to thermally regulate the high power amplifier 26, the heat sink 30 is designed to maximize heat loss for the high power amplifier 26 by selecting a material that offers high thermal conductivity and by providing a high surface area to transfer the heat away from the high power amplifier 26 device. In some embodiments, the heat sink 30 may have a width from about 5 mm to about 100 mm, from about 15 mm to about 50 mm, or from about 25 mm to about 30 mm. In some embodiments, the heat sink 30 may have a length from about 5 mm to about 100 mm, from about 20 mm to about 60 mm, or from about 30 mm to about 50 mm. In some embodiments, the heat sink 30 may have a height, that includes the dimensions of the flat base 34 and plurality of fins 38, from about 5 mm to about 100 mm, from about 20 mm to about 60 mm, or from about 30 mm to about 50 mm. In some embodiments, the heat sink 30 may have a total surface area from about 1,000 $mm^2$ to about 100,000 $mm^2$, from about 5,000 $mm^2$ to about 75,000 $mm^2$, from about 10,000 $mm^2$ to about 50,000 $mm^2$, from about 15,000 $mm^2$ to about 25,000 $mm^2$.

Figure 5:
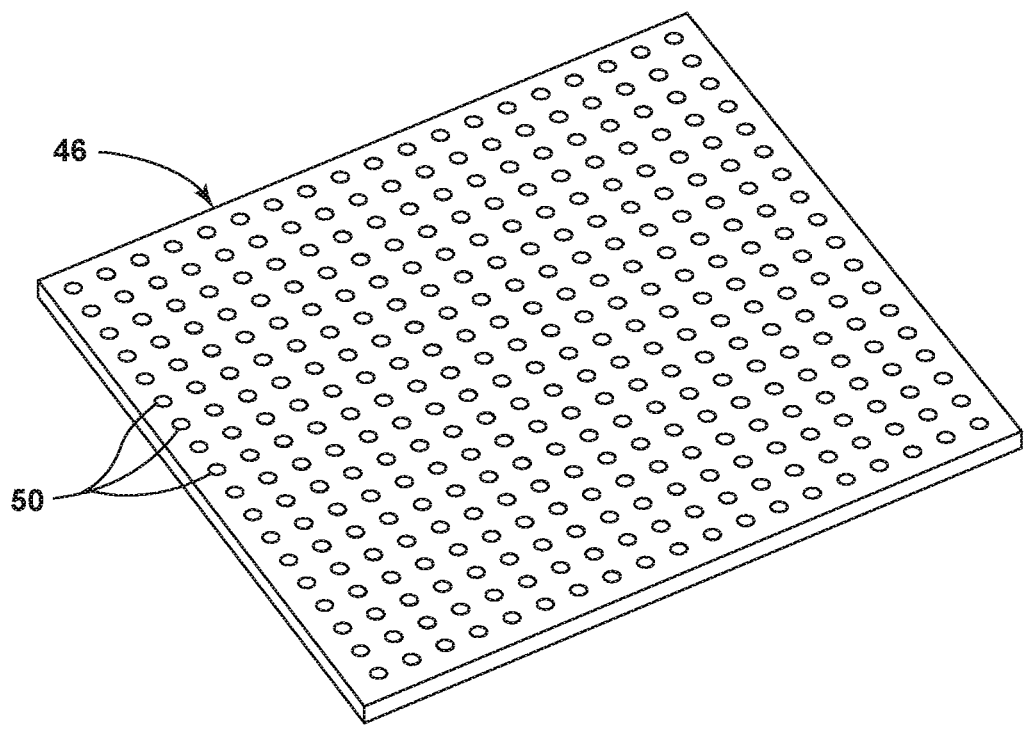
FIG. 5 is a perspective view of a thin metal plate according to one aspect of the present disclosure.

Referring now to FIG. 5, the thin metal plate 46 includes the plurality of perforations 50 extending across the surface of the thin metal plate 46. The number and total area of the perforations 50 may vary but in some embodiments the total area of the perforations 50 may be up to 90%, 80%, 70%, 60%, 50%, 40%, 30%, 20%, 10% of the total area of the thin metal plate. The thin metal plate 46 may be fabricated from highly thermally conductive materials such as metals, ceramics, or composites. In some embodiments, the heat sink 30 may be made or constructed from a metal including copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof. In some embodiments, the thin metal plate 46 may be made or constructed from copper and in other embodiments the thin metal plate 46 may be made or constructed from aluminum. In some embodiments, the thin metal plate 46 may have a thickness from about 0.010 inches thick to about 0.100 inches thick, from about 0.010 inches thick to about 0.050 inches thick, or from about 0.010 inches thick to about 0.0250 inches thick. In some embodiments, the thin metal plate 46 may be a submicron thin metal plate.

The plurality of perforations 50 positioned across the thin metal plate 46 may be formed by machining, stamping, molding, or by any other means known in the art. The plurality of perforations 50 may include one or more cross-sectional shapes including, for example, circles, squares, ovals, triangles, hexagons, or any other geometrical shape or combination thereof. In some embodiments, the plurality of perforations 50 are added to the thin metal plate 46 after fabrication of the thin metal plate 46 and in other embodiments the plurality of perforations 50 are added to the thin metal plate 46 during fabrication of the thin metal plate 46.

Figure 6:
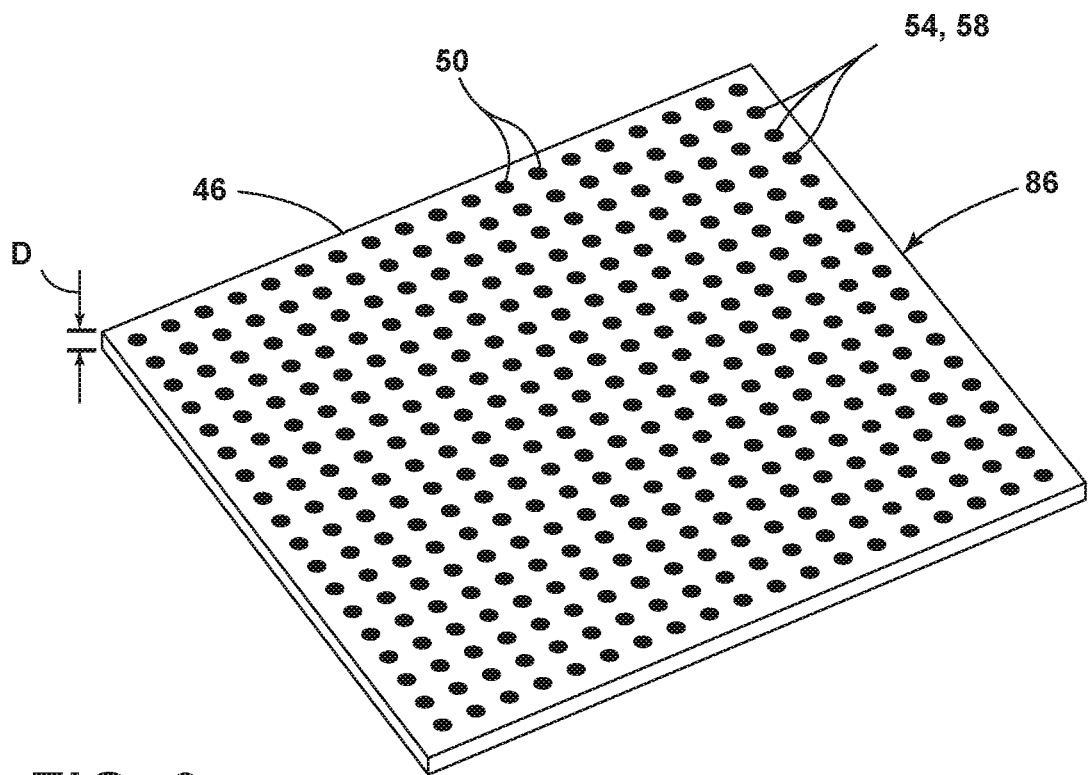
FIG. 6 is a perspective view of a carbon nanotube infused base plate according to one aspect of the present disclosure.

Referring now to FIG. 6, the plurality of perforations 50 in the thin metal plate 46 as described in FIG. 5 are shown filled with the epoxy resin 54 having a carbon nanotube 58 loading to form a carbon nanotube infused base plate 86. The epoxy resin 54 may be selected from any epoxy known in the art, especially those known and used to bind and mix carbon nanotubes and other carbon allotropes. In some examples, the epoxy resin 54 may include a mixture of a diglycidyl ether and one or more bisphenol molecules. The thickness of the carbon nanotube 58 infused epoxy resin 54 is designed to have the same or nearly similar thickness as the thin metal plate 46 represented as thickness D.

The carbon nanotubes 58 are homogeneously dispersed throughout the epoxy resin 54 so that they are uniformly distributed. To obtain effective dispersion of the carbon nanotubes 58 in the epoxy resin 54, an ionic liquid is used while using a thermostat to control the temperature. In some embodiments, the carbon nanotubes 58 may be diluted and dispersed at an individual carbon nanotube level in the epoxy resin 54 by facilitating the depletion of the physical bundles within the nanotube networks and controlling the molecular order of the carbon nanotubes 58 through the use of one or more ionic liquids. The ionic liquids used may be any ionic liquid known in the art. By controlling the distance between the dispersed carbon nanotubes 58 at different nanotube loadings, composites with enhanced fracture, mechanical, and thermomechanical properties may be obtained with no reduction in their thermal properties. In some embodiments, the epoxy resin 54 has the carbon nanotube 58 loading from about 1 wt % to about 25 wt %, from about 1 wt % to about 10 wt %, or from about 1 wt % to about 5 wt %. In some embodiments, the epoxy resin 54 has the carbon nanotube 58 loading of about 5 wt %, about 4 wt %, about 3 wt %, about 2 wt %, or about 1 wt %. Weight percent as used here means the weight fraction of the carbon nanotubes relative to the total weight of the epoxy resin 54 and carbon nanotube 58 composite mixture. The type of carbon nanotubes 58 loaded in the epoxy resin 54 may include any morphological or structural isomers found for carbon nanotubes, such as single-walled carbon nanotubes, double-walled carbon nanotubes, few-walled carbon nanotubes, multi-walled carbon nanotubes, short double-walled carbon nanotubes, thin multi-walled carbon nanotubes, short thin multi-walled carbon nanotubes, functionalized carbon nanotubes, and combinations thereof.

Figure 7:
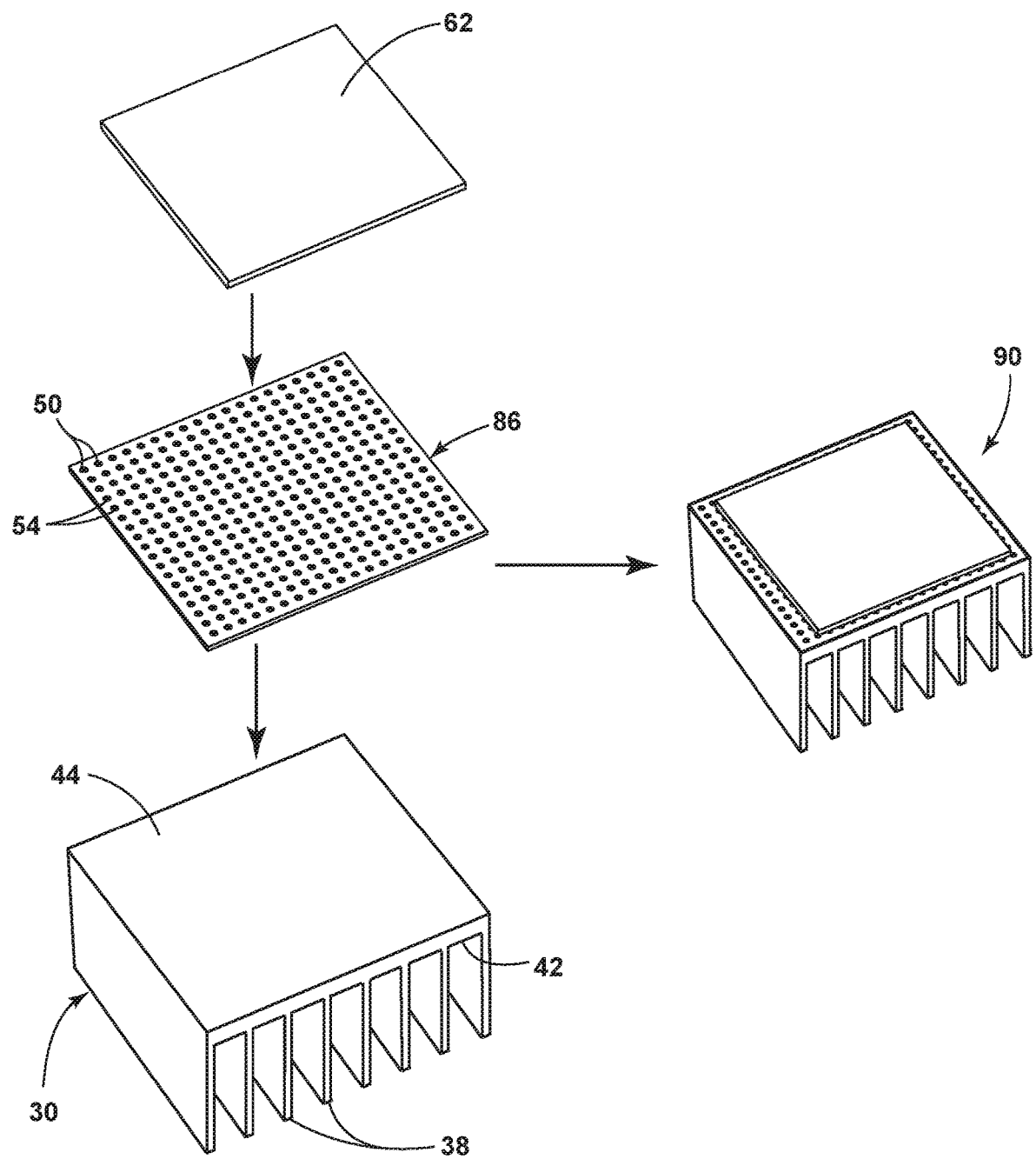
FIG. 7 shows the assembly of a carbon nanotube heat sink according to one aspect of the present disclosure.

Referring now to FIG. 7, the assembly of a carbon nanotube heat sink 90 includes coupling a void filler 62 to the carbon nanotube infused base plate 86 and the heat sink 30 where the carbon nanotube infused base plate 86 is sandwiched between the void filler 62 and the second side 44 of the heat sink 30. The void filler 62, carbon nanotube infused base plate 86, and heat sink 30 may be coupled together using an adhesive and/or a mechanical fastener. The carbon nanotube infused base plate 86 includes the carbon nanotube 58 infused epoxy resin 54 coupled within the plurality of perforations 50. In some embodiments, the carbon nanotube infused base plate 86 may be coupled to the second side 44 of the heat sink 30 using the same epoxy resin 54. In some embodiments, to ensure good mechanical adhesion, the bottom of the heat sink 30 may be designed and/or machined to create a rivet-like effect when cured to the carbon nanotube infused base plate 86.

The void filler 62 may include any heat conducting material known in the art that can conform to micro abrasions, hills, valleys, or any other surface imperfections, for example, Sil-Pads, greases or pastes containing nano-diamonds, metal particles, carbon black, or any other particles. The carbon nanotube heat sink 90 may be coupled to the high power amplifier 26 or any other device generating heat.

Figure 8:
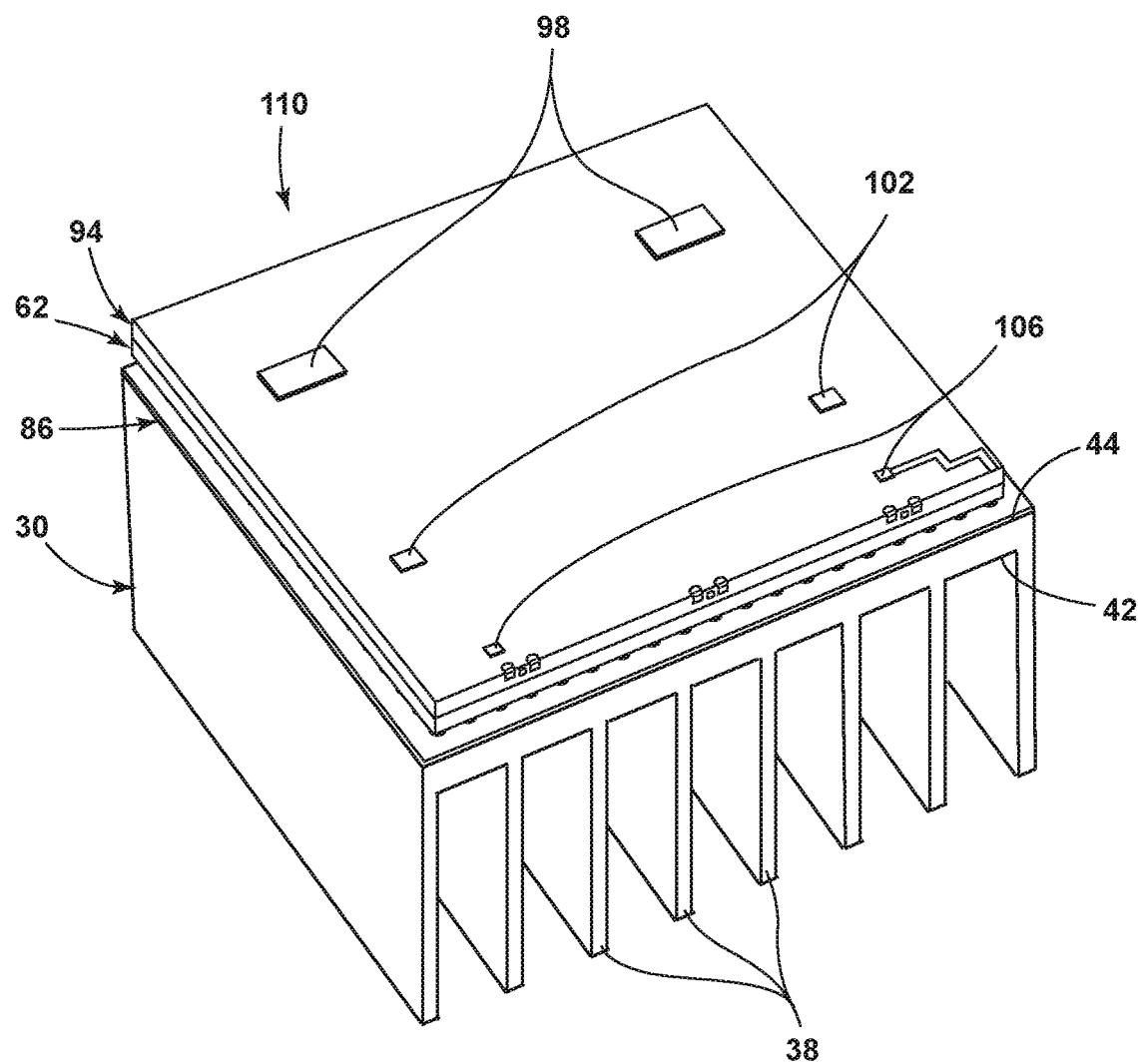
FIG. 8 is a bottom perspective view of a temperature regulated high power amplifier according to one aspect of the present disclosure.

Referring now to FIG. 8, a temperature regulated high power amplifier 110 is shown including a transistor box 94, the void filler 62, the carbon nanotube infused base plate 86, and the heat sink 30 having the plurality of fins 38. Included in the transistor box 94 are a first transistor pair 98, a second transistor pair 102, and a third transistor pair 106. In some embodiments, the high power amplifier may include two 240 watt, two 9 watt, and two 1 watt transistors that make up the 500 watt transistor box 94. In some embodiments, the one or more transistors may add up to a total transistor wattage of 500 watts. In other embodiments, the one or more transistors may add up to a total transistor wattage of 1000 watts. In still other embodiments, the one or more transistors may add up to a total transistor wattage of 2000 watts. In some embodiments, the void filler 62, carbon nanotube infused base plate 86, and heat sink 30 each have the same area as the transistor box 94 to provide a near complete overlap of each of the layers and in other embodiments, the void filler 62, carbon nanotube infused base plate 86, and heat sink 30 may each have varied areas to leave an edge or gap between the respective layers.

Figure 9:
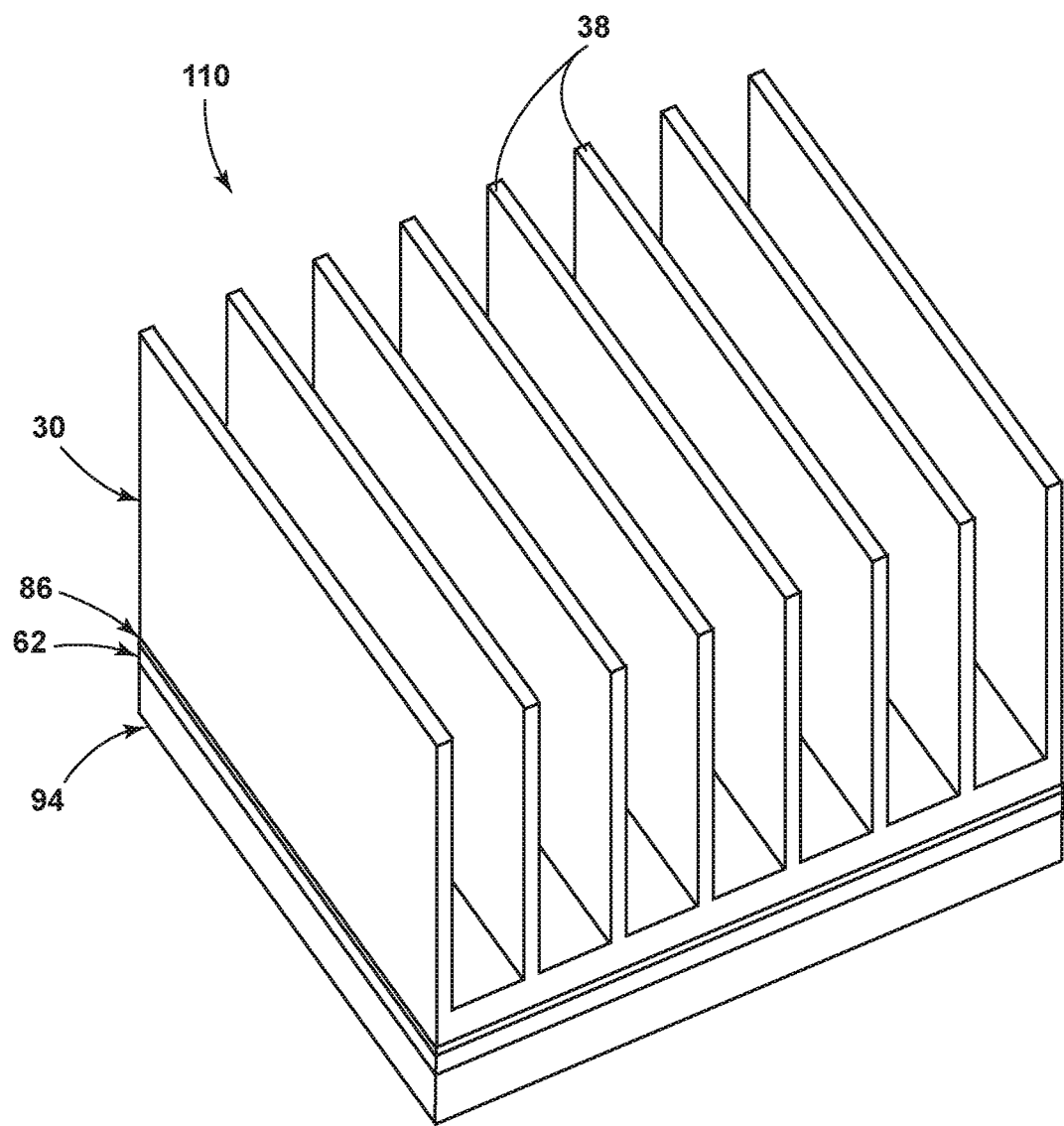
FIG. 9 is a top perspective view of a temperature regulated high power amplifier according to one aspect of the present disclosure.

Referring now to FIG. 9, the temperature regulated high power amplifier 110 is represented as being fully assembled having a structure including the transistor box 94, the void filler 62, the carbon nanotube infused base plate 86, and the heat sink 30 having the plurality of fins 38 starting from the bottom layer and moving up.

Figure 10:
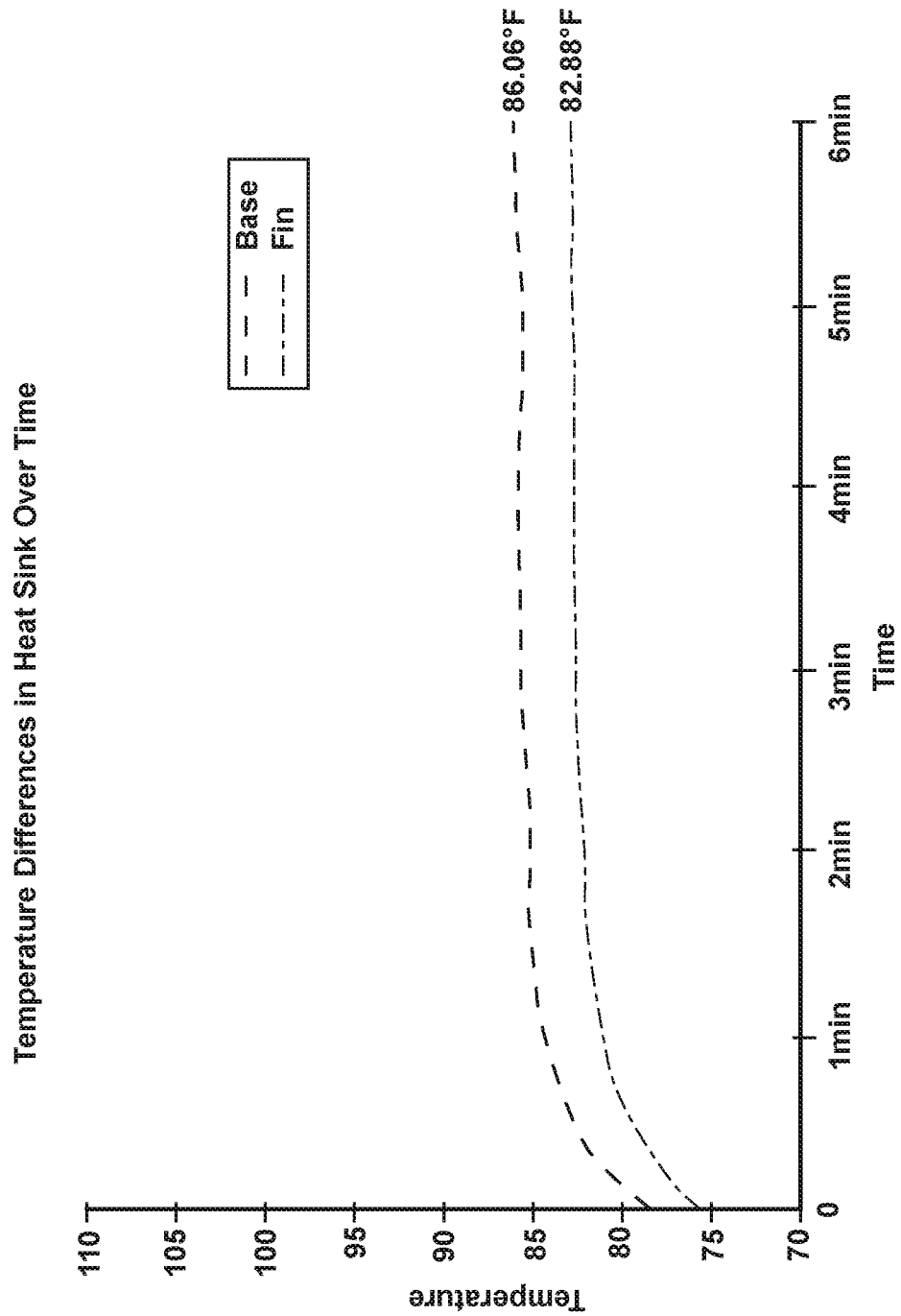
FIG. 10 is a graph showing the temperature differences in a heat sink over time.

Referring now to FIG. 10, the heat sink 30 was positioned on an electrical heater with the void filler 62 sandwiched between the heat sink 30 and the electrical heater with the plurality of fins 38 pointing out away from the surface of the electrical heater. This arrangement of heat sink 30 and void filler 62 on the electrical heater is used as a comparative example. Two separate temperature readings were monitored on the heat sink 30. The first monitored temperature was measured using a thermocouple positioned between the void filler 62 and the second side 44 of the flat base 34 in the heat sink 30. The second measured temperature was performed using a thermocouple positioned at the top of the center fin 38. The two respective plots shown in FIG. 10 represent the first and second monitored temperatures and this data demonstrates the ability of the heat sink 30 to thermally conduct heat away from the electric heater to the surrounding environment. As shown, the average difference in temperature between the flat base 34 and the center fin 38 was approximately 3.18° F.

Figure 11:
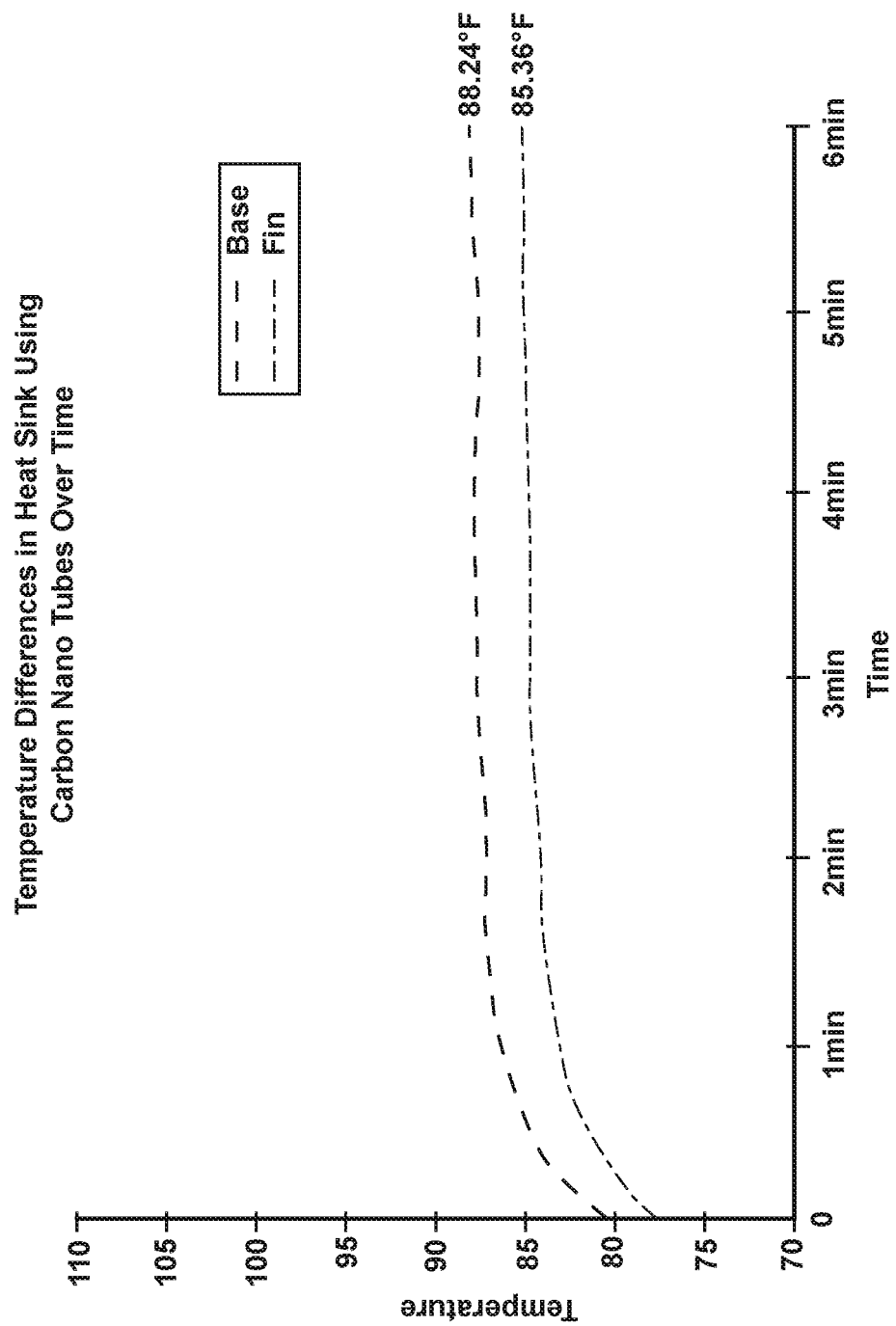
FIG. 11 is graph showing the temperature differences in a heat sink using carbon nanotubes over time.

Referring now to FIG. 11, the carbon nanotube heat sink 90 was positioned on an electrical heater with the void filler 62 in direct contact with the electrical heater and the plurality of fins 38 pointing out away from the surface of the electrical heater. Two separate temperature readings were monitored on the carbon nanotube heat sink 90. The first monitored temperature was performed using a thermocouple positioned between the void filler 62 and the carbon nanotube infused base plate 86 of the carbon nanotube heat sink 90. The second monitored temperature was performed using a thermocouple positioned at the top of the center fin 38. The two respective plots shown in FIG. 11 represent the first and second monitored temperatures and this data demonstrates the ability of the carbon nanotube heat sink 90 to thermally conduct heat away from the electric heater to the surrounding environment. As shown, the average difference in temperature between the carbon nanotube infused base plate 86 and the center fin 38 was approximately 2.88° F.

Comparing the results from FIGS. 10-11, the use of the carbon nanotube infused base plate 86 with the heat sink 30 and void filler 62 increases the thermal conductivity of the device and lowers the difference in temperature ($\Delta T$) by about 0.30° F. or about 10%. Using the carbon nanotube infused base plate 86 with the heat sink 30 can be expected to improve heat loss by moving heat up the conductive fins 38 by at least 30%, by at least 25%, by at least 20%, by at least 15%, by at least 10%, or by at least 5%.

Figure 12:
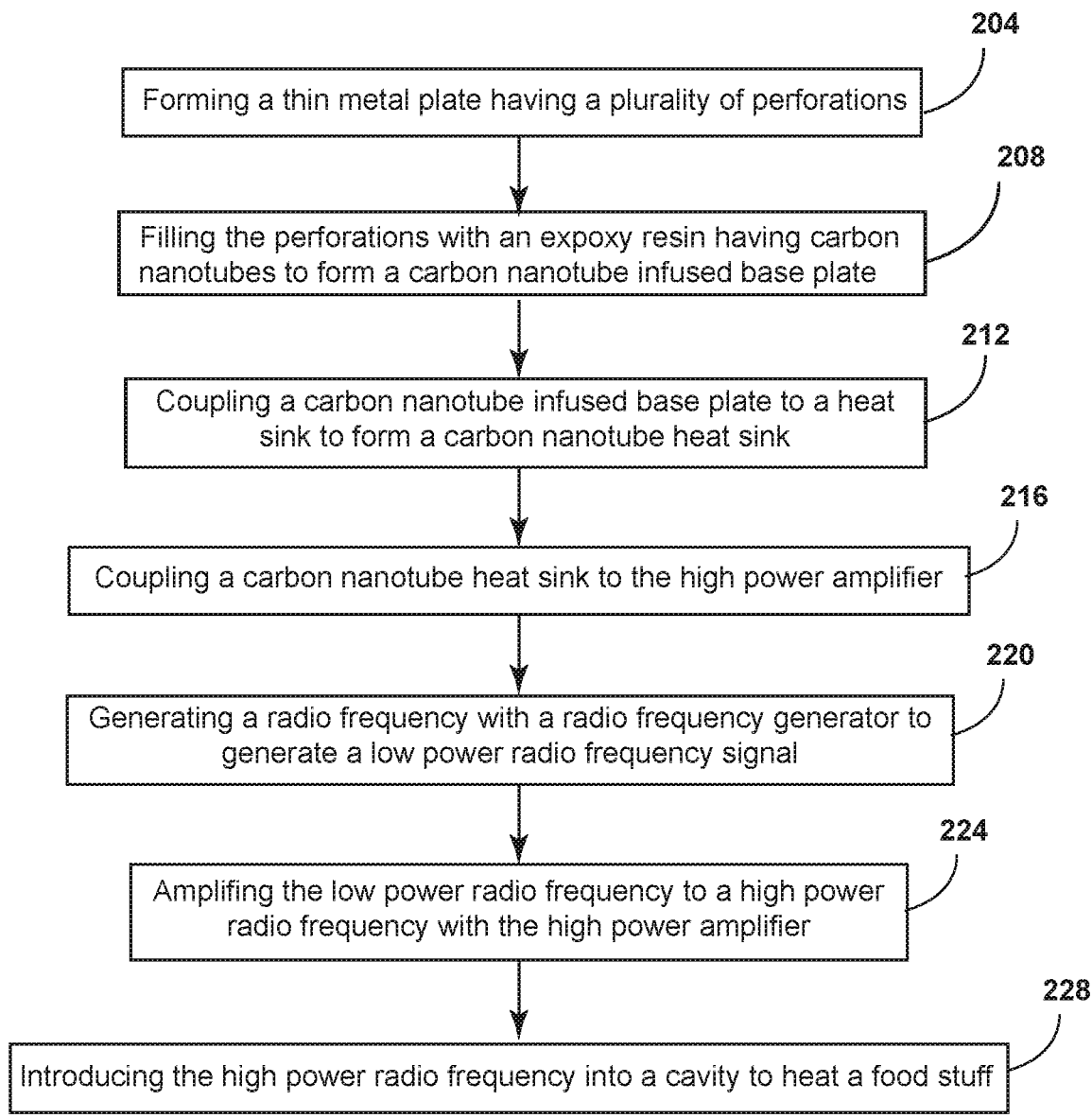
FIG. 12 is a schematic flow diagram illustrating a method for thermally managing a high power amplifier in an electromagnetic cooking device according to one aspect of the present disclosure.

Referring now to FIG. 12, a method 200 is disclosed for thermally managing the high power amplifier 26 in the electromagnetic cooking device 10. According to method 200, the electromagnetic cooking device 10 is offered by forming the thin metal plate 46 having the plurality of perforations 50 (step 204). The plurality of perforations 50 are filled with the epoxy resin 54 having carbon nanotubes 58 to form the carbon nanotube infused base plate 86 (step 208). The carbon nanotube infused base plate 86 is coupled to the heat sink 30 to form the carbon nanotube heat sink 90 (step 212). The carbon nanotube heat sink 90 is coupled to the high power amplifier 26 (step 216). The radio frequency signal generator 22 then generates a radio frequency to generate a low power radio frequency signal (step 220) where the low power radio frequency signal is then amplified to a high power radio frequency with the high power amplifier 26 (step 224). The high power radio frequency is then introduced into the cavity 14 to heat the foodstuff (step 228).

It is understood that the descriptions outlining and teaching the temperature regulated high power amplifier 110 previously discussed, which can be used in any combination, apply equally well to the method disclosed in FIG. 12, where applicable, further disclosing a method for thermally managing the high power amplifier 26 in the electromagnetic cooking device 10.

Experimental

The test bed was used to create a test procedure that could be duplicated with tolerable precision. This test bed basically provides, on a ceramic plate, a location to install an electrical heater of the type made from Kapton and resistive copper coils etched between polyamide cap sheets much like those used in contemporary flexible circuits known in the printed circuits manufacturing industry. The test is designed to compare the difference in temperature (ΔT) between the heat source and the middle fin 38 on top of the heat sink 30 to each other. A closer or smaller difference in temperature (ΔT) would indicate better thermal conduction throughout the heat sink 30.

A precision DC power supply was used to power the Kapton heater that provides digital readouts to ensure exact power transfer to the heat source. In both the tests, the control sample (FIG. 10) and the nanotube enhanced version (FIG. 11) each received precisely 2.7 Watts sent to the electric heater by controlling the voltage at 9 VDC and the current at 0.3 Amps.

In each sample, a 0.030" thick "Sil-Pad" was adhered to the base to try and ensure there would be no air gaps between the heater and the respective tested heat sinks. After the samples were centered and stacked on the heater, a one kilogram weight was added to the top of the heat sinks to simulate being bolted or clamped to the top of the heat source or high power amplifier. Each sample was run separately in the same manner described for a period of one hour.

Data acquisition was achieved by applying a "T" type thermocouple from Omega Engineering, previously calibrated, to the bottom of the respective heat sink between the Sil-Pad and the base and to the middle fin centered on the top of the heat sink. A rubber pressure pad was used in both the tests to ensure the contact resistance on the fins was of equal proportion. A plastic shield was then used to cover the entire test to prevent air conditioning or other ambient air currents interfering with the test.

It will be understood by one having ordinary skill in the art that construction of the described device and other components is not limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

LISTING OF NON-LIMITING EMBODIMENTS

Embodiment A is an electromagnetic cooking device comprising: a cavity in which a foodstuff is placed, a plurality of radio frequency feeds configured to introduce electromagnetic radiation into the cavity for heating the foodstuff, a radio frequency signal generator configured to generate a low power radio frequency signal, a high power amplifier coupled to the radio frequency signal generator wherein the high power amplifier is configured to amplify the low power radio frequency signal to a high power radio frequency signal, a heat sink coupled to the high power amplifier wherein the heat sink comprises a flat base coupled to a plurality of fins extending perpendicularly from a first side of the flat base, and a thin metal plate having a plurality of perforations wherein the perforations are filled with an epoxy resin having a carbon nanotube loading wherein the thin metal plate is positioned between the heat sink and high power amplifier.

The electromagnetic cooking device of Embodiment A wherein the carbon nanotube loading is homogeneously dispersed in the epoxy resin.

The electromagnetic cooking device of Embodiment A or Embodiment A with any of the intervening features wherein the epoxy resin has the carbon nanotube loading of about 1 wt % to about 25 wt %.

The electromagnetic cooking device of Embodiment A or Embodiment A with any of the intervening features wherein the epoxy resin has the carbon nanotube loading of about 5 wt %.

The electromagnetic cooking device of Embodiment A or Embodiment A with any of the intervening features wherein the carbon nanotube loading comprises any morphology of single-walled carbon nanotubes, double-walled carbon nanotubes, few-walled carbon nanotubes, multi-walled carbon nanotubes, short double-walled carbon nanotubes, thin multi-walled carbon nanotubes, short thin multi-walled carbon nanotubes, functionalized carbon nanotubes, and combinations thereof.

The electromagnetic cooking device of Embodiment A or Embodiment A with any of the intervening features wherein the thin metal plate comprises a metal selected from the group consisting of copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof.

The electromagnetic cooking device of Embodiment A or Embodiment A with any of the intervening features wherein the heat sink comprises a metal selected from the group consisting of copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof.

The electromagnetic cooking device of Embodiment A or Embodiment A with any of the intervening features wherein the epoxy resin comprises a mixture of a diglycidyl ether and one or more bisphenol molecules.

The electromagnetic cooking device of Embodiment A or Embodiment A with any of the intervening features wherein the thin metal plate has a thickness from about 0.010 inches thick to about 0.100 inches thick.

The electromagnetic cooking device of Embodiment A or Embodiment A with any of the intervening features wherein the heat sink is coupled to the high power amplifier through an adhesive and/or a mechanical fastener.

Embodiment B is a method for thermally managing a high power amplifier in an electromagnetic cooking device, the method comprising: forming a thin metal plate having a plurality of perforations, filling the perforations with an epoxy resin comprising carbon nanotubes to form a carbon nanotube infused base plate, coupling the carbon nanotube infused base plate to a second side of a heat sink wherein the heat sink comprises a flat base coupled to a plurality of fins extending perpendicularly from a first side of the flat base, coupling the second side of the heat sink with the carbon nanotube infused base plate to the high power amplifier, generating a radio frequency with a radio frequency signal generator configured to generate a low power radio frequency signal, amplifying the low power radio frequency signal to a high power radio frequency signal with the high power amplifier coupled to the radio frequency signal generator, and introducing the high power radio frequency (electromagnetic radiation) into a cavity for heating a foodstuff with a plurality of radio frequency feeds.

The method of Embodiment B wherein filling the perforations with an epoxy resin comprising carbon nanotubes includes using a loading of about 5 wt % carbon nanotubes.

The method of Embodiment B or Embodiment B with any of the intervening features wherein the carbon nanotubes comprises any morphology of single-walled carbon nanotubes, double-walled carbon nanotubes, few-walled carbon nanotubes, multi-walled carbon nanotubes, short double-walled carbon nanotubes, thin multi-walled carbon nanotubes, short thin multi-walled carbon nanotubes, functionalized carbon nanotubes, and combinations thereof.

The method of Embodiment B or Embodiment B with any of the intervening features wherein forming the thin metal plate having the plurality of perforations includes using a metal selected from the group consisting of copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof.

The method of Embodiment B or Embodiment B with any of the intervening features wherein the thin metal plate having the plurality of perforations is formed having a thickness from about 0.010 inches thick to about 0.100 inches think.

The method of Embodiment B or Embodiment B with any of the intervening features wherein the second side of the heat sink and the carbon nanotube infused base plate is coupled to the high power amplifier using an adhesive and/or a mechanical fastener.

Embodiment C is a temperature regulated high power amplifier comprising: a radio frequency signal generator configured to generate a low power radio frequency signal, a high power amplifier coupled to the radio frequency signal generator wherein the high power amplifier is configured to amplify the low power radio frequency signal to a high power radio frequency signal, a heat sink coupled to the high power amplifier wherein the heat sink comprises a flat base coupled to a plurality of fins extending perpendicularly from a first side of the flat base, and a thin metal plate having a plurality of perforations wherein the perforations are filled with an epoxy resin having a carbon nanotube loading.

The temperature regulated high power amplifier of Embodiment C wherein the epoxy resin has the carbon nanotube loading of about 1 wt % to about 25 wt %.

The temperature regulated high power amplifier of Embodiment C or Embodiment C with any of the intervening features wherein the carbon nanotube loading comprises any morphology of single-walled carbon nanotubes, double-walled carbon nanotubes, few-walled carbon nanotubes, multi-walled carbon nanotubes, short double-walled carbon nanotubes, thin multi-walled carbon nanotubes, short thin multi-walled carbon nanotubes, functionalized carbon nanotubes, and combinations thereof.

What is claimed is:

1. An electromagnetic cooking device comprising:
a cavity in which a foodstuff is placed;
a plurality of radio frequency feeds configured to introduce electromagnetic radiation into the cavity for heating the foodstuff;
a radio frequency signal generator configured to generate a low power radio frequency signal;
a high power amplifier coupled to the radio frequency signal generator wherein the high power amplifier is configured to amplify the low power radio frequency signal to a high power radio frequency signal;
a heat sink coupled to the high power amplifier wherein the heat sink comprises a flat base coupled to a plurality of fins extending perpendicularly from a first side of the flat base; and
a thin metal plate having a plurality of perforations wherein the perforations are filled with an epoxy resin having a carbon nanotube loading wherein the thin metal plate is positioned between the heat sink and high power amplifier.

2. The electromagnetic cooking device of claim 1, wherein the carbon nanotube loading is homogeneously dispersed in the epoxy resin.

3. The electromagnetic cooking device of claim 1, wherein the epoxy resin has the carbon nanotube loading of 1 wt % to 25 wt %.

4. The electromagnetic cooking device of claim 1, wherein the epoxy resin has the carbon nanotube loading of 5 wt %.

5. The electromagnetic cooking device of claim 1, wherein the carbon nanotube loading comprises any morphology of single-walled carbon nanotubes, double-walled carbon nanotubes, few-walled carbon nanotubes, multi-walled carbon nanotubes, short double-walled carbon nanotubes, thin multi-walled carbon nanotubes, short thin multi-walled carbon nanotubes, functionalized carbon nanotubes, and combinations thereof.

6. The electromagnetic cooking device of claim 1, wherein the thin metal plate comprises a metal selected from the group consisting of copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof.

7. The electromagnetic cooking device of claim 1, wherein the heat sink comprises a metal selected from the group consisting of copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof.

8. The electromagnetic cooking device of claim 1, wherein the epoxy resin comprises a mixture of a diglycidyl ether and one or more bisphenol molecules.

9. The electromagnetic cooking device of claim 1, wherein the thin metal plate has a thickness from 0.010 inch thick to 0.100 inch thick.

10. The electromagnetic cooking device of claim 1, wherein the heat sink is coupled to the high power amplifier through at least one of an adhesive and a mechanical fastener.

11. A method for thermally managing a high power amplifier in an electromagnetic cooking device, the method comprising:
forming a thin metal plate having a plurality of perforations;
filling the perforations with an epoxy resin comprising carbon nanotubes to form a carbon nanotube infused base plate;
coupling the carbon nanotube infused base plate to a second side of a heat sink wherein the heat sink comprises a flat base coupled to a plurality of fins extending perpendicularly from a first side of the flat base;
coupling the second side of the heat sink with the carbon nanotube infused base plate to the high power amplifier;
generating a radio frequency with a radio frequency signal generator configured to generate a low power radio frequency signal;
amplifying the low power radio frequency signal to a high power radio frequency signal with the high power amplifier coupled to the radio frequency signal generator; and
introducing the high power radio frequency (electromagnetic radiation) into a cavity for heating a foodstuff with a plurality of radio frequency feeds.

12. The method for thermally managing the high power amplifier in the electromagnetic cooking device of claim 11, wherein filling the perforations with an epoxy resin comprising carbon nanotubes includes using a loading of 1 wt % to 25 wt % carbon nanotubes.

13. The method for thermally managing the high power amplifier in the electromagnetic cooking device of claim 11, wherein filling the perforations with an epoxy resin comprising carbon nanotubes includes using a loading of 5 wt % carbon nanotubes.

14. The method for thermally managing the high power amplifier in the electromagnetic cooking device of claim 11, wherein the carbon nanotubes comprise any morphology of single-walled carbon nanotubes, double-walled carbon nanotubes, few-walled carbon nanotubes, multi-walled carbon nanotubes, short double-walled carbon nanotubes, thin multi-walled carbon nanotubes, short thin multi-walled carbon nanotubes, functionalized carbon nanotubes, and combinations thereof.

15. The method for thermally managing the high power amplifier in the electromagnetic cooking device of claim 11, wherein forming the thin metal plate having the plurality of perforations includes using a metal selected from the group consisting of copper, aluminum, brass, beryllium, steel, iron, magnesium, platinum, rhodium, titanium, tungsten, zinc, selenium, tantalum, tin, vanadium, zirconium, gold, silver, cobalt, chromium, cadmium, iridium, antimony, bismuth, and combinations thereof.

16. The method for thermally managing the high power amplifier in the electromagnetic cooking device of claim 11, wherein the thin metal plate having the plurality of perforations is formed having a thickness from about 0.010 inch thick to about-0.100 inch thick.

17. The method for thermally managing the high power amplifier in the electromagnetic cooking device of claim 11, wherein the second side of the heat sink and the carbon nanotube infused base plate are coupled to the high power amplifier using at least one of an adhesive and a mechanical fastener.

18. A temperature regulated high power amplifier comprising:
a radio frequency signal generator configured to generate a low power radio frequency signal;

a high power amplifier coupled to the radio frequency signal generator wherein the high power amplifier is configured to amplify the low power radio frequency signal to a high power radio frequency signal;

a heat sink coupled to the high power amplifier wherein the heat sink comprises a flat base coupled to a plurality of fins extending perpendicularly from a first side of the flat base; and a thin metal plate having a plurality of perforations wherein the perforations are filled with an epoxy resin having a carbon nanotube loading.

19. The electromagnetic cooking device of claim 18, wherein the epoxy resin has the carbon nanotube loading of 1 wt % to 25 wt %.

20. The electromagnetic cooking device of claim 18, wherein the carbon nanotube loading comprises any morphology of single-walled carbon nanotubes, double-walled carbon nanotubes, few-walled carbon nanotubes, multi-walled carbon nanotubes, short double-walled carbon nanotubes, thin multi-walled carbon nanotubes, short thin multi-walled carbon nanotubes, functionalized carbon nanotubes, and combinations thereof.

* * * * *